United States Patent
Chai et al.

(10) Patent No.: US 12,557,410 B2
(45) Date of Patent: Feb. 17, 2026

(54) BIO-INSPIRED IMAGING DEVICE WITH IN-SENSOR VISUAL ADAPTATION

(71) Applicant: THE HONG KONG POLYTECHNIC UNIVERSITY, Hong Kong (CN)

(72) Inventors: Yang Chai, Hong Kong (CN); Fuyou Liao, Hong Kong (CN)

(73) Assignee: The Hong Kong Polytechnic University, Hong Kong (CN)

( * ) Notice: Subject to any disclaimer, the term of this patent is extended or adjusted under 35 U.S.C. 154(b) by 525 days.

(21) Appl. No.: 17/649,070

(22) Filed: Jan. 27, 2022

(65) Prior Publication Data

US 2023/0238406 A1 Jul. 27, 2023

(51) Int. Cl.
*H10F 39/00* (2025.01)
*H10F 30/28* (2025.01)
*H10F 77/123* (2025.01)

(52) U.S. Cl.
CPC ... *H10F 39/80377* (2025.01); *H10F 30/2877* (2025.01); *H10F 39/8053* (2025.01); *H10F 77/123* (2025.01)

(58) Field of Classification Search
CPC ......... H01L 27/14616; H01L 27/14621; H01L 31/0296; H01L 31/1129
USPC ...................................................... 257/431
See application file for complete search history.

(56) References Cited

U.S. PATENT DOCUMENTS

| | | | |
|---|---|---|---|
| 2005/0072989 A1* | 4/2005 | Bawendi | B82Y 10/00 257/E29.302 |
| 2016/0133762 A1* | 5/2016 | Blasco Claret | G02B 13/0085 438/69 |
| 2016/0372615 A1* | 12/2016 | Yang | H01L 31/1129 |
| 2018/0129043 A1* | 5/2018 | Kim | G06F 3/0416 |
| 2019/0123223 A1* | 4/2019 | Astley | G01J 1/44 |

OTHER PUBLICATIONS

H. Jang, C. Liu, H. Hinton, M.-H. Lee, H. Kim, M. Seol, H.-J. Shin, S. Park, D. Ham, An Atomically Thin Optoelectronic Machine Vision Processor. Adv. Mater. 2020, 32, 2002431. (Year: 2020).*

(Continued)

*Primary Examiner* — Norman D Richards
*Assistant Examiner* — Laura M Dykes
(74) *Attorney, Agent, or Firm* — S&F/WEHRW

(57) ABSTRACT

A bio-inspired imaging device mimicking visual adaptation of human vision provides a large dynamic range in imaging an image. The device employs a neuromorphic vision sensor realized with phototransistors each being a field-effect transistor, a channel layer of which is an atomically-thin layer of two-dimensional semiconductor material. The channel layer is intentionally formed with defects trap states for trapping a portion of charge carriers generated by a light beam incident on the phototransistor such that intensity information of the light beam is memorized. A gate-source voltage directs the defects trap states to de-trap the trapped portion of charge carriers or to further trap an additional portion of charge carriers, allowing the phototransistor to exhibit a time-dependent excitation or inhibition effect on drain current to thereby enable the imaging sensor to mimic scotopic or photopic adaptation in imaging the image.

17 Claims, 13 Drawing Sheets

(56) References Cited

OTHER PUBLICATIONS

Hong, S., Zagni, N., Choo, S. et al. Highly sensitive active pixel image sensor array driven by large-area bilayer MoS2 transistor circuitry. Nat Commun 12, 3559 (2021) (Year: 2021).*

Z. He et al., "An organic transistor with light intensity-dependent active photoadaptation," Nature Electronics, vol. 4, pp. 522-529, Jul. 2021.

D. Xie et al., "Photoelectric Visual Adaptation Based on 0D-CsPbBr3-Quantum-Dots/2D-MoS2 Mixed-Dimensional Heterojunction Transistor," Advanced Functional Material, vol. 31, issue 14, Apr. 1, 2021, 2010655.

S. Hong et al., "Sensory Adaptation and Neuromorphic Phototransistors Based on CsPb(Br1-xIx)3 Perovskite and MoS2 Hybrid Structure," ACS Nano 2020, 14, 8, 9796-9806.

Q. Chen, "Switchable Perovskite Photovoltaic Sensors for Bioinspired Adaptive Machine Vision," Advanced Intelligent Systems, vol. 2, issue 9, Sep. 2020, 2000122.

K. F. Mak et al., in "Atomically thin MoS2: A new direct-gap semiconductor," Physical Review Letters, 105, 136805, Sep. 24, 2010.

L. Wang et al., in "Tuning magnetotransport in a compensated semimetal at the atomic scale," arXiv:1510.04827v2, Oct. 19, 2015.

\* cited by examiner

BIO-INSPIRED IMAGING DEVICE WITH IN-SENSOR VISUAL ADAPTATION

ABBREVIATIONS

2D Two dimensional
ADC Analog-to-digital converter
BP Boron phosphide
CCR Current change ratio
CMOS Complementary metal oxide semiconductor
DOS Density of states
FET Field effect transistor
IR Infrared
ITO Indium tin oxide
TMD Transition metal dichalcogenide
TMO Transition metal oxide
UVO Ultraviolet-ozone

FIELD OF THE INVENTION

The present invention generally relates to an imaging device. In particular, the present invention relates to a bio-inspired imaging device for mimicking visual adaptation of human vision in imaging an image.

BACKGROUND

The development of machine vision (e.g., in intelligent vehicles, mobile medical devices, real-time video analysis and cooperative autonomous driving) demands imaging sensors with ultrahigh resolution, high image-capturing speed, stable imaging performance, and capability of imaging under a wide range of illumination conditions. The last requirement is translated into a need for imaging sensors to image objects under dim-light and bright-light conditions. A large dynamic range in imaging the objects is required. Accurate imaging under a wide range of illumination conditions is critical for correct perception of the environment by humans, because natural light normally used in illuminating objects for human viewing spans a very large range of 280 dB in light intensity. It requires imaging sensors to accurately capture and detect more shadow and highlighted details. Currently, imaging sensors realized by silicon-based CMOS technologies usually have a dynamic range of 70 dB, much narrower than the range of illumination conditions of interest in illuminating natural scenes. To develop an imaging sensor adaptive to a wide range of lighting conditions, one usually employs one or more of techniques that include controlling an optical aperture, adopting a liquid lens, adjusting an exposure time, and applying denoising algorithms in post processing. These techniques usually require complex hardware and software resources.

There is a need in the art for an improved imaging sensor that enables imaging under a wide range of illumination conditions while being simple to implement or operate.

SUMMARY OF THE INVENTION

An aspect of the present invention is to provide a bio-inspired imaging device with in-sensor visual adaptation for imaging an image.

The imaging device comprises an imaging sensor. The imaging sensor comprises a plurality of phototransistors. An individual phototransistor for converting a light beam of the image to an electrical signal is a FET comprises a source, a drain, a gate and a channel layer. The channel layer connects the source and the drain. The channel layer is an atomically-thin layer composed of a 2D semiconductor material for generating charge carriers upon irradiation by the light beam in forming the electrical signal. In particular, the channel layer is formed with defects trap states for trapping a portion of the charge carriers such that intensity information of the light beam is memorized by the defects trap states. Furthermore, the channel layer is positioned in proximity to the gate. Hence, a gate-source voltage between the gate and the source directs the defects trap states to de-trap the trapped portion of the charge carriers over time or to further trap an additional portion of the charge carriers over time. It allows the individual phototransistor to exhibit a time-dependent excitation or inhibition effect on the electrical signal to thereby enable the imaging sensor to mimic visual adaptation of human vision in imaging the image. By producing effects similar to visual adaptation, the disclosed imaging device advantageously achieves a large dynamic range in imaging the image.

Preferably, the imaging device further comprises one or more gate drivers and one or more computing processors. The one or more gate drivers is used for providing respective gate-source voltages to the plurality of phototransistors. The one or more computing processors are configured to determine the respective gate-source voltages and control the one or more gate drivers to provide the determined respective gate-source voltages to the plurality of phototransistors for causing the imaging sensor to mimic visual adaptation in imaging the image.

Preferably, the one or more computing processors are further configured to control the one or more gate drivers to provide: a positive gate-source voltage to the individual phototransistor if photopic adaptation is mimicked in imaging the image; and a negative gate-source voltage to the individual phototransistor if scotopic adaptation is mimicked in imaging the image.

In certain embodiments, the respective gate-source voltages applied to the plurality of phototransistors at each time instant are same, allowing reduced complexity implementation of the one or more gate drivers.

For the imaging sensor, it is preferable that the atomically-thin layer used to form the channel layer consists of one or two monolayers of the 2D semiconductor material.

The 2D semiconductor material used to form the channel layer may be selected from TMDs, TMOs, MXenes, BP, nanoribbon graphene and carbon nanotubes.

In certain embodiments, the 2D semiconductor material is selected to be $MoS_2$.

Preferably, the imaging device further comprises a dielectric layer sandwiched between the gate and the channel layer. In certain embodiments, the dielectric layer is substantially composed of a material selected from $Al_2O_3$, $HfO_2$, $ZrO_2$ and h-BN.

In certain embodiments, the plurality of phototransistors is formed on a substrate. The gate of the individual phototransistor is located on the substrate.

In certain embodiments, the source and drain are made of metal, indium tin oxide or graphene.

In certain embodiments, the gate is made of metal, indium tin oxide or graphene.

In certain embodiments, the plurality of phototransistors is arranged as a rectangular array in the imaging sensor for capturing the image.

It is preferable that the imaging sensor further comprises a plurality of optical components for optically processing respective light beams of the image before the respective light beams reach the plurality of phototransistors. Preferably, the optical components include a microlens located in proximity to the individual phototransistor for focusing the light beam onto the individual phototransistor. Optionally, the plurality of optical components further includes a color filter located in proximity to the individual phototransistor for enabling the individual phototransistor to extract color information of the light beam. It is also optional that the plurality of optical components further includes an IR-stop filter overlying the plurality of phototransistors for filtering off IR components of the respective light beams before the image is imaged by the plurality of phototransistors.

Optionally, the imaging device further comprises one or more ADCs for digitizing respective electrical signals received from the plurality of phototransistors to form a plurality of digitized electrical signals. The one or more computing processors are further configured to: receive the plurality of digitized electrical signals obtained at a time instant to form an image signal of the image at the time instant; and collect respective image signals obtained at a plurality of successive time instants to form a sequence of image signals.

In certain embodiments, the one or more computing processors are further configured to adjust the respective gate-source voltages applied to the plurality of phototransistors according to an incident power density of the light beam of an individual image in an optical-image sequence for realizing Weber's law in generating the sequence of image signals from the optical-image sequence.

Other aspects of the present invention are disclosed as illustrated by the embodiments hereinafter.

Figure 1:
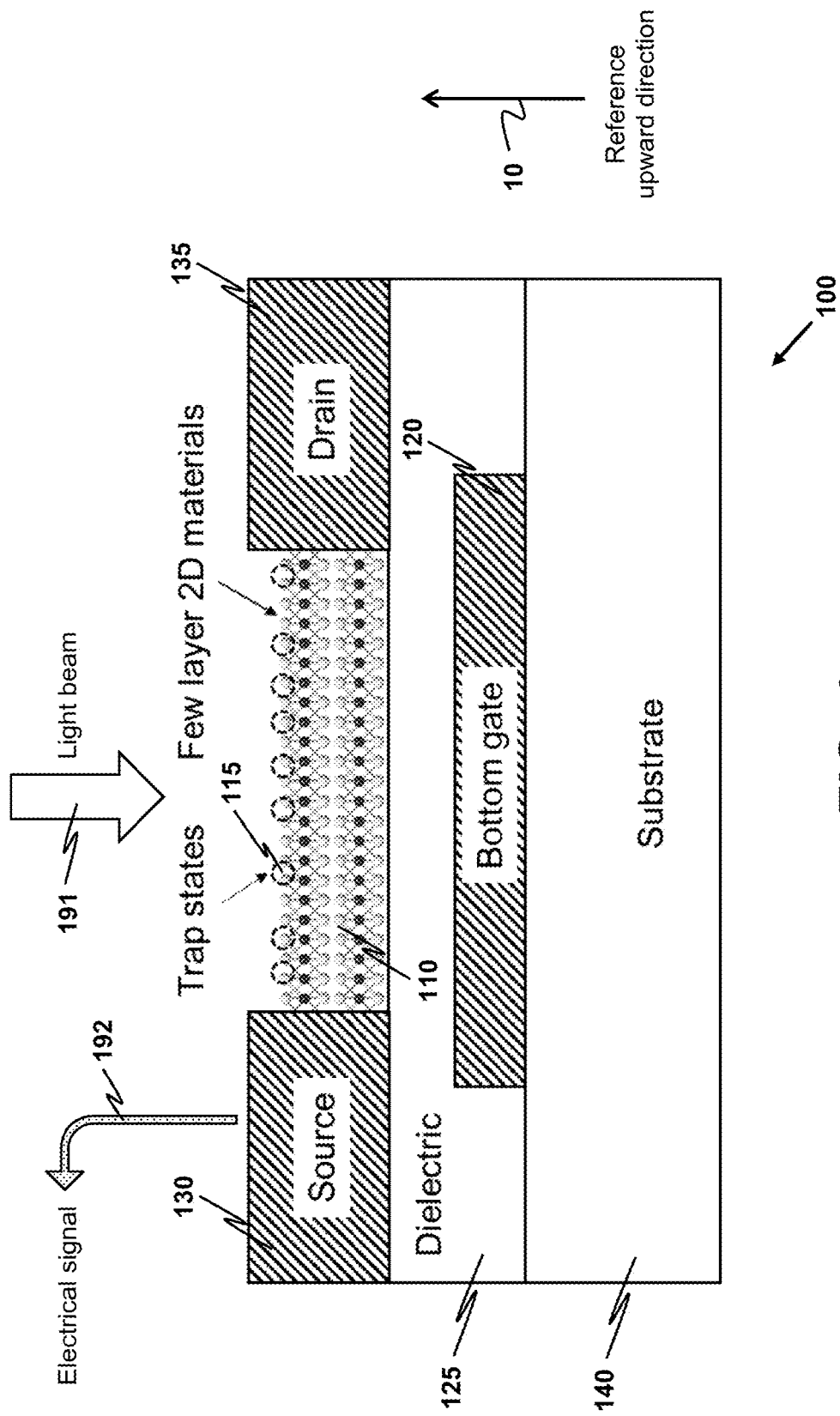
FIG. 1 depicts an exemplary structure of an adaptive vision sensor, which is a phototransistor and which can adapt to different illumination scenes at photo-sensory terminals.

Skilled artisans will appreciate that elements in the figures are illustrated for simplicity and clarity and have not necessarily been depicted to scale.

DETAILED DESCRIPTION

The following detailed description is merely exemplary in nature and is not intended to limit the present invention or the application and uses of the invention. Furthermore, there is no intention to be bound by any theory presented in the preceding background or the following detailed description.

As used herein, "visual adaptation" means a brief and temporary change in visual sensitivity or perception when a subject is exposed to a new optical stimulus, and by the lingering aftereffects when the stimulus is removed.

As used herein, "scotopic adaptation" means visual adaptation of the eye to vision (viz., to see) in the dark or in an environment with dim-light illumination.

As used herein, "photopic adaptation" means visual adaptation of the eye to vision (viz., to see) in the sunlight or in bright illumination.

As used herein, "two-dimensional material" or "2D material" means a material usable to form a solid consisting of one or few layers of constituents, where an individual constituent is an atom or compound, and each layer is a monolayer having a thickness of one count of the aforesaid atom or compound.

As used herein, "2D semiconductor material" means a 2D material capable of forming a semiconductor. Examples of the 2D semiconductor material include TMDs [e.g., molybdenum disulfide ($MoS_2$), tungsten disulfide ($WS_2$), molybdenum diselenide ($MoSe_2$), tungsten diselenide ($WSe_2$) and molybdenum ditelluride ($MoTe_2$)], TMOs [e.g., molybdenum trioxide ($MoO_3$) and vanadium pentoxide ($V_2O_5$)], MXenes [e.g., titanium carbide ($Ti_2C$)], BP, nanoribbon graphene, and carbon nanotubes.

As used herein, "atomically-thin layer" of a 2D material means a solid layer formed by at most nine monolayers of constituents of the 2D material. In the art, there is no consensus on the number of monolayers that collectively form an atomically-thin layer. For example, K. F. MAK et al., in "Atomically thin $MoS_2$: A new direct-gap semiconductor," *Physical Review Letters*, 105, 136805, 24 Sep. 2010, consider that an atomically-thin layer has at most six monolayers, whereas L. WANG et al., in "Tuning magnetotransport in a compensated semimetal at the atomic scale," arXiv:1510.04827v2, 19 Oct. 2015, consider that an atomically-thin layer may consist of at most nine monolayers. Herein, an atomically-thin layer has at most nine monolayers of the compound.

Disclosed herein is a bio-inspired imaging device for imaging an image with an advantage of mimicking visual adaptation of human vision in imaging the image. The types of visual adaptation that is mimicked include both scotopic adaptation and photopic adaptation. Furthermore, the imaging device employs a plurality of phototransistors self-adaptive in mimicking the visual adaptation such that in-sensor visual adaptation is achieved. By producing effects similar to visual adaptation, the disclosed imaging device advantageously achieves a large dynamic range in imaging the image.

The disclosed bio-inspired imaging device is developed based on research results on electro-optical properties of an adaptive vision sensor, which is a phototransistor realized as a FET with an atomically-thin layer of a 2D semiconductor material. Before the disclosed imaging device is elaborated, details of the adaptive vision sensor are first provided. Electrical and optical properties thereof are also detailed.

An overview of the adaptive vision sensor is first given. The adaptive vision sensor was inspired by the visual adaptation mechanism of the human retina. The sensor is a semiconductor optoelectronic device, and can adapt to different illumination scenes at photo-sensory terminals. The light-intensity-dependent characteristics of the adaptive vision sensor match well with Weber's law, in which the perceived change in stimuli is proportional to the light stimuli. The gate terminal of the phototransistor facilitates vision adaptation with highly localized and dynamic modulation of photo-sensitivity under different illumination conditions at a pixel level, exhibiting a large effective perception range. Through this in-sensor adaptation process in the receptive field, the phototransistor array shows image memorization and image contrast enhancement for both scotopic and photopic adaptation, exhibiting a wide perception range and improvement of image recognition rate.

FIG. 1 depicts an exemplary structure of an adaptive vision sensor 100. A reference upward direction 10 is defined as shown in FIG. 1. Herein in the specification and appended claims, positional and directional words such as "above," "below," "higher," "upper," "lower," "top," "bottom" and "horizontal" for describing the adaptive vision sensor 100 are interpreted with reference to the reference upward direction 10.

The sensor 100 is a phototransistor (also referenced as 100 for convenience) based on a FET structure, which includes a local bottom gate 120 on a substrate 140, a dielectric layer 125 on the bottom gate 120, a channel layer 110 based on a semiconductor material that is light-sensitive, and a source 130 and a drain 135. The channel layer 110 is an atomically-thin layer of a 2D semiconductor material. Defects trap states 115 are intentionally introduced to the channel layer 110, e.g., by UVO treatment or oxygen plasma treatment to the channel layer 110. Normally, both the UVO treatment and oxygen plasma treatment generate the defects trap states 115 on a surface of the channel layer 110. Typically in operating the adaptive vision sensor 100, the source 130 is grounded, a fixed voltage is applied to the drain 135, and the bottom gate 120 has a voltage that is adjustable. The light is absorbed by the channel layer 110, leading to a reduction of channel resistance and an increase of drain current ($I_D$). Note that the bottom gate 120, which is simply a gate of the FET, is located below the channel layer 110, and a light beam 191 is irradiated on a top side of the channel layer 110 so that the bottom gate 120 does not block the light beam 191 in arriving the channel layer 110. Also note that $I_D$ forms an electrical signal 192 in photo-converting the light beam 191.

In the theoretical explanation and experimental results to be given below, the channel layer 110 is selected to be a bilayer $MoS_2$ film, which consists of two monolayers of $MoS_2$, as an example for demonstrating photoconversion properties of the sensor 100.

Figure 2A:
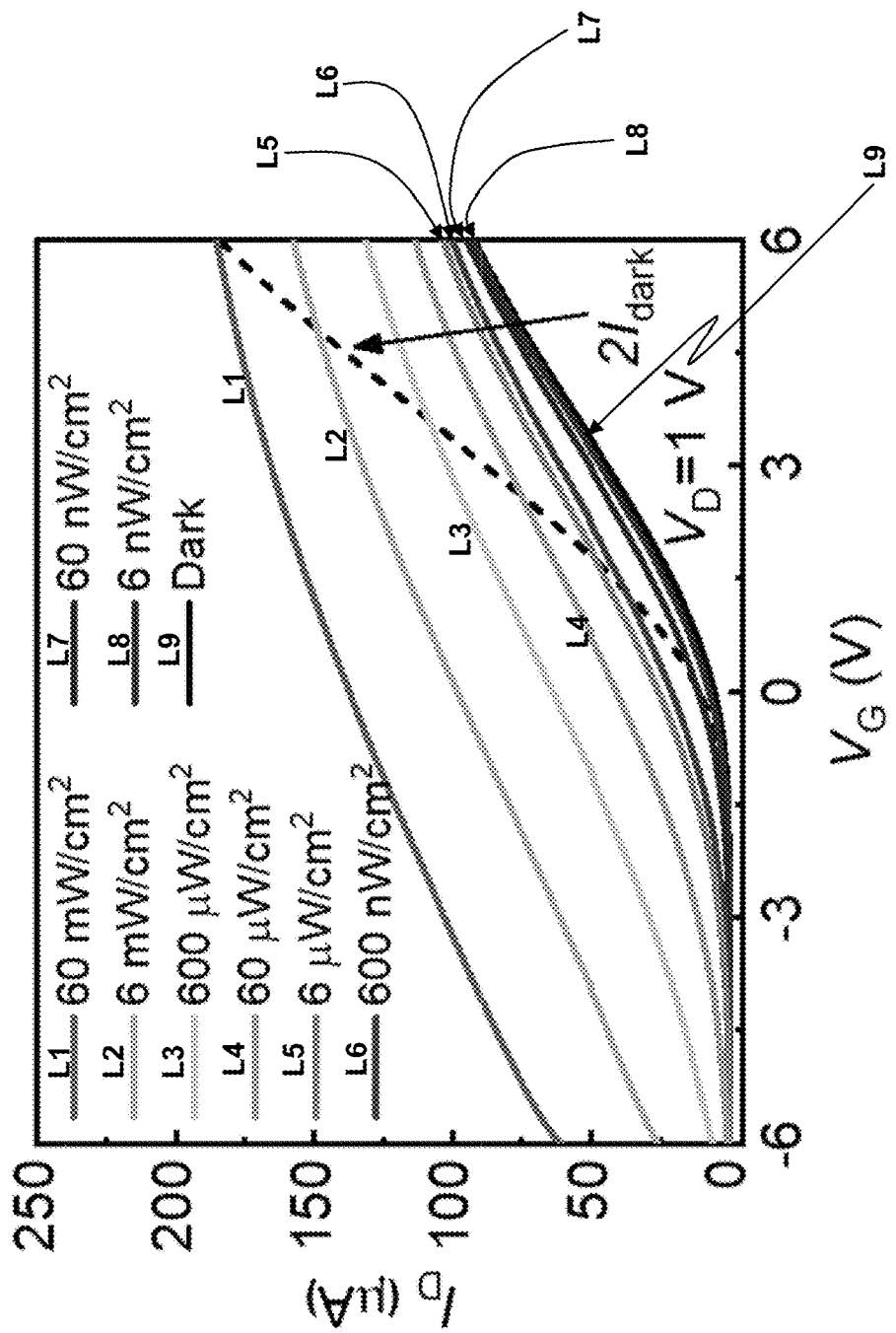
FIG. 2A shows transfer characteristic curves of the phototransistor at a drain-source voltage of 1V under different illumination conditions ranging from 6 nW/cm$^2$ to 60 mW/cm$^2$ in incident power density.

FIG. 2A shows the transfer characteristic curves of the phototransistor 100 at a drain-source voltage ($V_D$), or a drain voltage in simplicity, of $V_D=1V$ under different illumination conditions ranging from 6 nW/cm² to 60 mW/cm² (at 660 nm wavelength) in incident power density ($P_{in}$). The threshold voltage ($V_{TH}$) of the phototransistor 100 shifts towards a more negative value with an increase of $P_{in}$. This result indicates that the carrier density increases under brighter illumination. In analogy to the visual threshold of a retina, one may define a threshold $I_D=2^1 I_{dark}$ as a just noticeable photocurrent, where $I_{dark}$ represents the drain current at $V_D=1V$ under a dark condition (i.e. without any light irradiation on the sensor 100). The value of $I_{dark}$ increases with $V_G$, the gate-source voltage, or the gate voltage in simplicity. Thus, the threshold $I_D$ also increases with $V_G$. This result can be utilized to emulate Weber's law. The photosensitivity ($S_{ph}$) is defined as $$S_{ph} = \frac{I_{ph}}{I_{dark}} = \frac{I_{illumination} - I_{dark}}{I_{dark}} \qquad (1)$$

where $I_{illumination}$ is a value of $I_D$ under illumination, and $I_{ph}$ is the photocurrent defined as $I_{ph}=I_{illumination}-I_{dark}$.

Figure 2B:
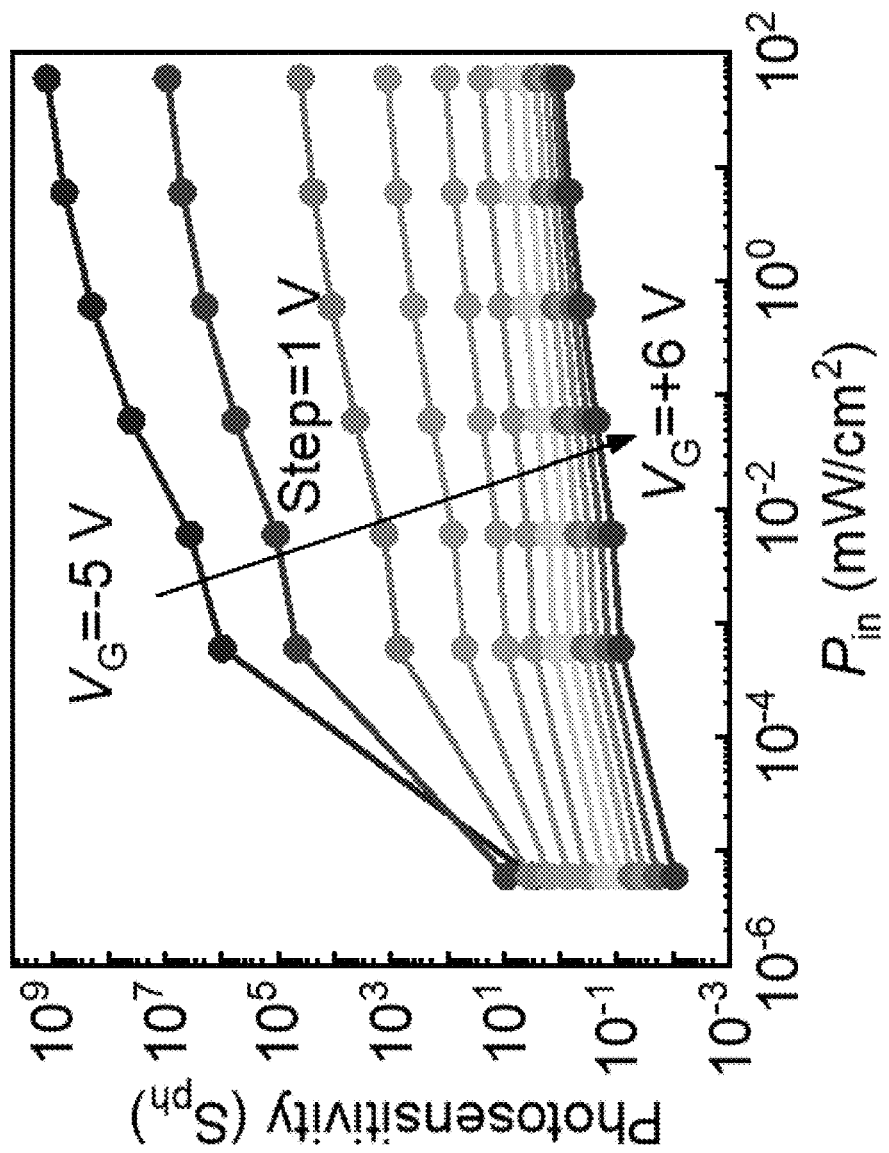
FIG. 2B plots photosensitivity values of the phototransistor as a function of the incident power density under different gate-source voltage values.

FIG. 2B plots $S_{ph}$ values as a function of $P_{in}$ under different values of $V_G$ (from −5V to +6V with a step of 1V). When a negative $V_G$ is applied, the value of $S_{ph}$ is much higher than that obtained at a positive $V_G$, and the $S_{ph}$ value increases almost linearly with $P_{in}$ because of the photoconductive mechanism. In contrast, the value of $S_{ph}$ is relatively low at positive $V_G$ and increases sublinearly with $P_{in}$, which results from the photogating effect. These characteristics unambiguously show that the adaptive vision sensor 100 has a high $S_{ph}$ value under a negative $V_G$ (similar to the characteristics of rod cells), while a low $S_{ph}$ value is obtained under a positive $V_G$ (similar to the characteristics of cone cells).

Figure 2C:
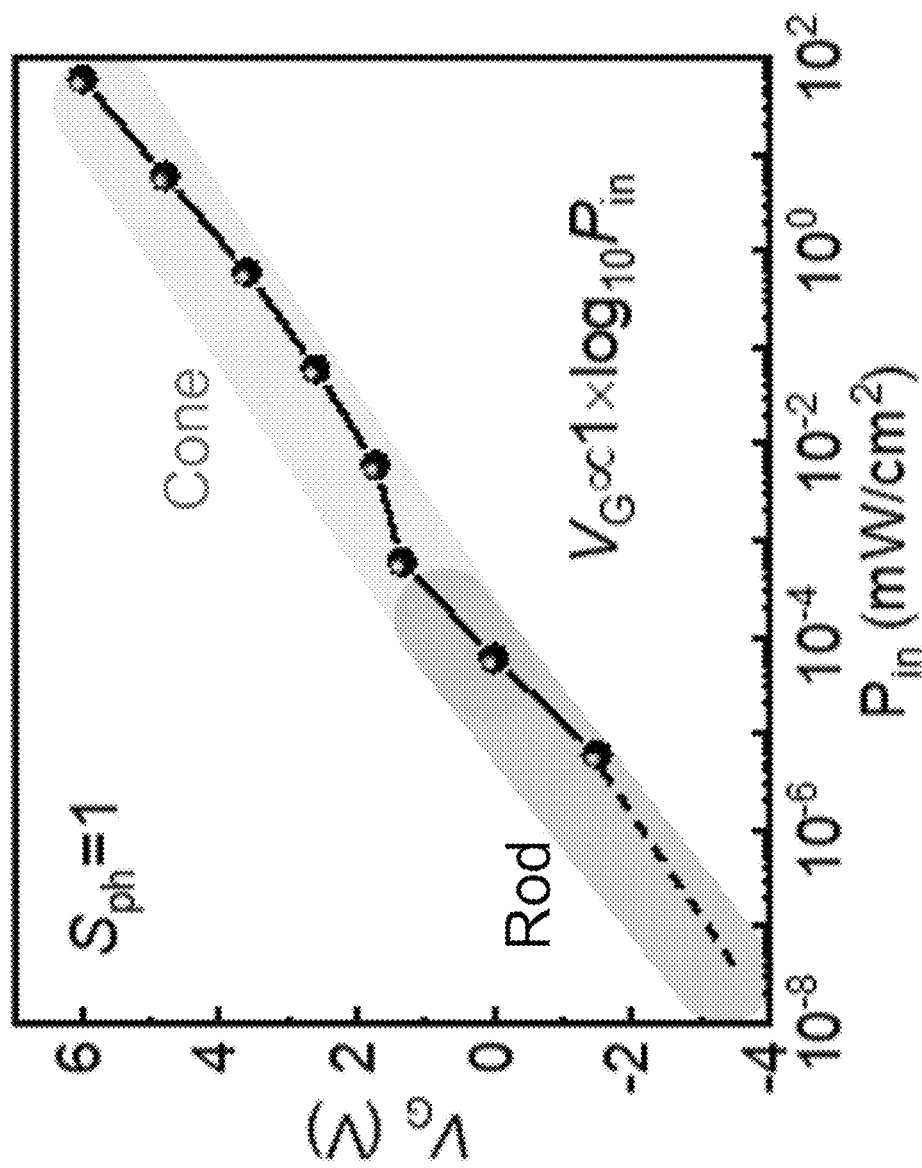
FIG. 2C depicts a plot showing a relationship between the gate-source voltage and the incident power density at unity photosensitivity.
Figure 2D:
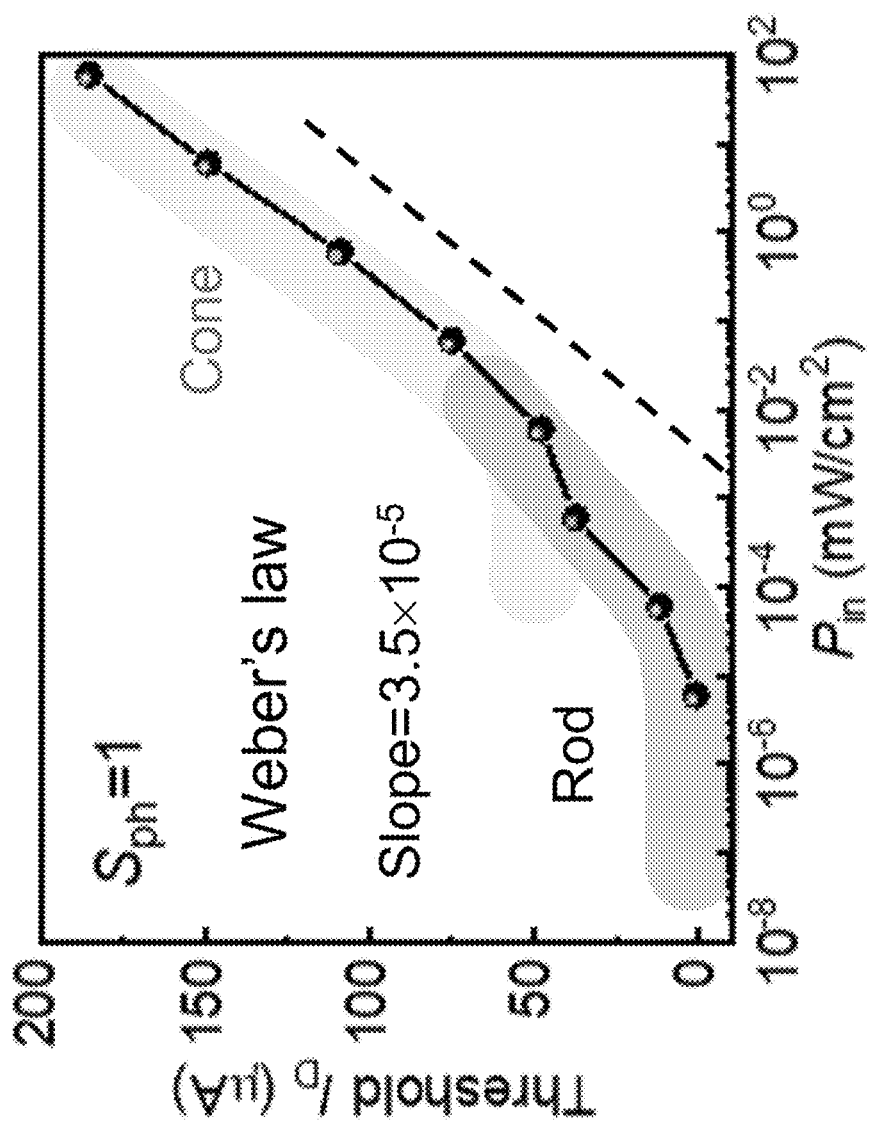
FIG. 2D plots the threshold drain current of the phototransistor against the incident power density at unity photosensitivity.

FIG. 2C depicts a plot showing a relationship between $V_G$ and $P_{in}$ at $S_{ph}=1$. The plot shows a slope of 1 on a linear-log scale. According to different $P_{in}$ values, one can apply different $V_G$ values to modulate the characteristics of the phototransistor 100. A positive $V_G$ value tunes the phototransistor 100 into an operating region such that the phototransistor 100 operates with characteristics similar to the characteristics of cone cells of the photoreceptor, while a negative $V_G$ value corresponds to rod cells of the photoreceptor. FIG. 2D plots the threshold $I_D$ against $P_{in}$ at $S_{ph}=1$. The plot shows that the threshold $I_D$ increases with an increase of $P_{in}$ at a slope of $3.5\times10^{-5}$ on a log-log scale, matching well with the trend of Weber's law. The phototransistor 100 at a positive $V_G$ (cone) works well for an illumination level at photopic level (about $10^{-3}$ to $10^2$ mW/cm²), and the phototransistor 100 at a negative $V_G$ (rod) is adapted well for an illumination level at scotopic level (about $10^{-8}$ to $10^{-3}$ mW/cm²). In this way, the adaptive vision sensor 100 can fit well with Weber's law by applying locally different $V_G$ values to the sensor 100 according to different $P_{in}$ values. This phenomenon is similar to the switchover between rod and cone cells in photoreceptors by the negative feedback of horizontal cells of retina according to different light illumination conditions.

Figures 3A, 3B, 3C:
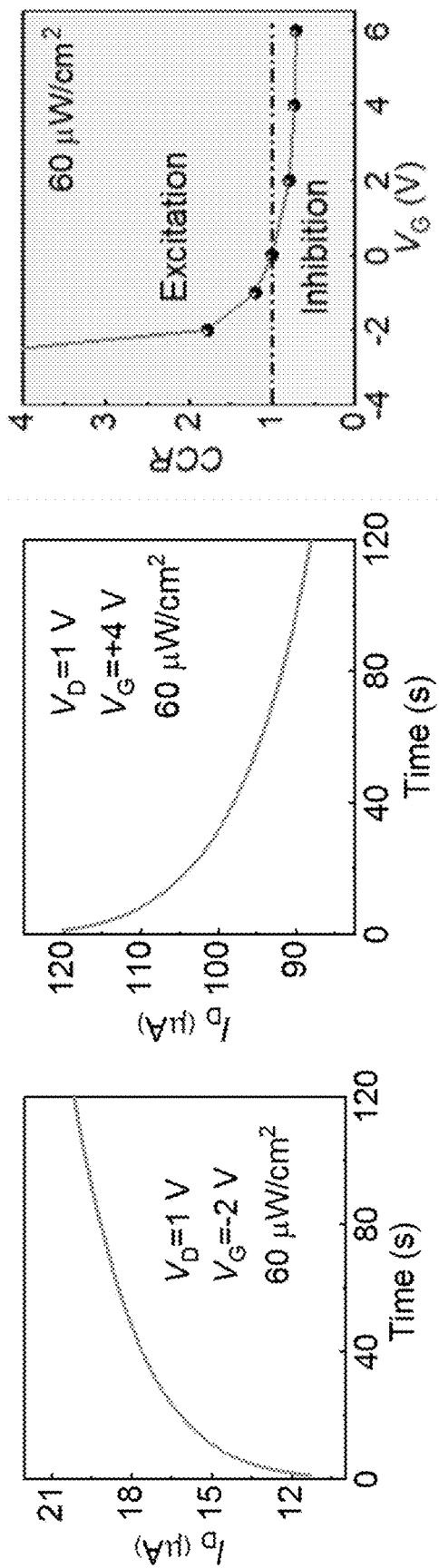
FIG. 3A plots the drain current of the phototransistor over time under a negative gate-source voltage.
FIG. 3B plots the drain current of the phototransistor over time under a positive gate-source voltage.
FIG. 3C plots the current change ratio against the gate-source voltage for the phototransistor.

FIG. 3A depicts a plot of $I_D$ of the phototransistor 100 over time under a negative $V_G$. The result indicates that $I_D$ increases gradually over time at a negative $V_G$, showing a current excitation characteristic due to the de-trapping mechanism of the defects trap states 115 at the surface of channel layer 110. The de-trapped electrons lead to the increase of $I_D$. This phenomenon is similar to the regeneration of photopigment in photoreceptors of an eye, leading to an increase of visual sensitivity of photoreceptors. In this case, a fixed negative $V_G$ (horizontal cell) gives rise to electron de-trapping (photopigment regeneration).

FIG. 3B depicts a plot of $I_D$ of the phototransistor 100 over time under a positive $V_G$. In contrast to the case of a negative $V_G$, the result of FIG. 3B indicates that $I_D$ decreases gradually over time when a positive $V_G$ is applied to the phototransistor 100, showing a current inhibition behavior of the phototransistor 100. The phenomenon of the decrease of $I_D$ over time under continuous illumination is analogous to the decrease of visual sensitivity of photoreceptor cells over time under a bright light condition. The mechanism of trap states trapping electrons is similar to the bleaching of photopigment in the retina, leading to the decrease of visual sensitivity of photoreceptors. A positive $V_G$ (horizontal cell) leads to electron trapping (photopigment bleaching).

To quantitatively compare the degree of current excitation and inhibition effect, one may compute a CCR of the sensor 100 by $$CCR = \frac{I_{D-120\,s}}{I_{D-0\,s}} \quad (2)$$

where $I_{D-0\,s}$ is the value of $I_D$ at an initial state, and $I_{D-120\,s}$ is the value of $I_D$ measured at a time of 120 s. FIG. 3C plots CCR against $V_G$. When $V_G$ is more negative, the CCR value is greater than 1, indicating a more obvious current excitation effect. When $V_G$ is more positive, the CCR value is less than 1, suggesting a more obvious current inhibition effect.

Figure 4:
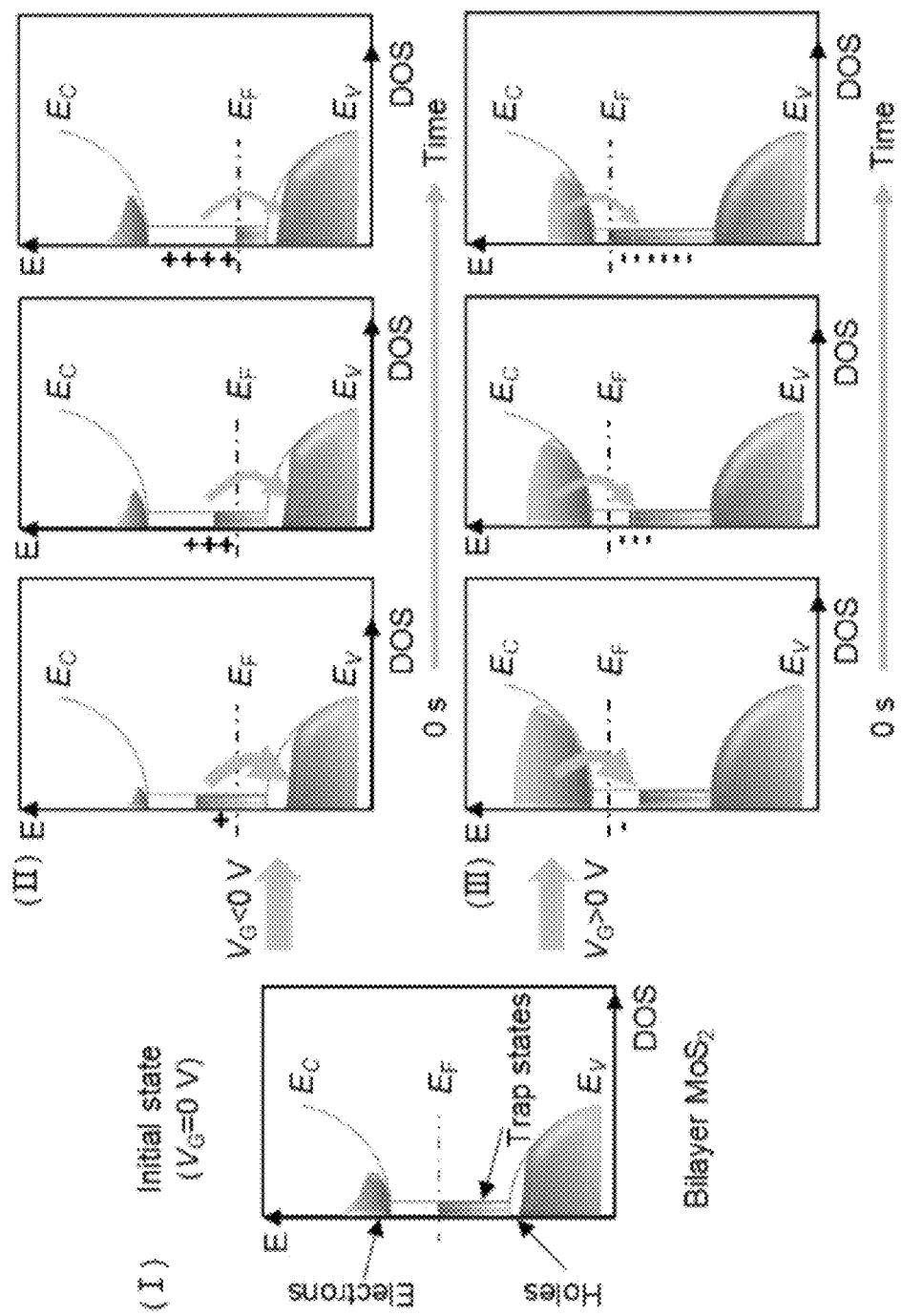
FIG. 4 depicts a schematic band structure of the phototransistor against DOS under gate-source voltages with different polarities.

FIG. 4 depicts a schematic band structure of the phototransistor 100 against DOS under $V_G$ values with different polarities. The band diagrams of the phototransistor 100, as shown in FIG. 4, may be used to explain the above-mentioned phenomena of time-dependent current excitation (inhibition) effect under a negative (positive) $V_G$. The channel layer 110, which is an atomically-thin $MoS_2$ layer that is UVO treated, possesses a lot of localized trap states in the band gap. These trap states are mainly resulted from S vacancies defect configurations. These trap states are distributed over a broad energy range in the band gap, exhibiting ambipolar trap states. At the initial state ($V_G$=0V), the net charge of these trap states is close to zero, as shown in subplot (I) of FIG. 4 (all donor-type traps are occupied with electrons, and all acceptor-type traps are vacant). When a negative $V_G$ ($V_G$=−2V) is applied, the Fermi level ($E_F$) is lowered. The donor-type traps above $E_F$ de-trap electrons and become positively charged after accomplishing the de-trapping process of electrons, inducing more electrons in the conductive band ($E_r$) and increasing $I_D$. The shallow donor-type traps firstly de-trap electrons after a negative $V_G$ is applied. As the time prolongs, the deeper traps de-trap electrons, as shown in subplot (II) of FIG. 4. The de-trapped electrons lead to the increase of $I_D$. This phenomenon is similar to the regeneration of photopigment and results in the increase of visual sensitivity of photoreceptor. In this case, a fixed negative $V_G$ (horizontal cell) gives rise to electron de-trapping (photopigment regeneration).

In contrast, when a positive $V_G$ ($V_G$=+4V) is applied, $E_F$ is elevated. The acceptor-type states below $E_F$ trap the electrons from $E_C$, leading to the decrease of electrons in $E_C$ as shown in subplot (III) of FIG. 4. The shallow acceptor-type traps firstly trap electrons after a positive $V_G$ is applied. As the time goes on, the deep trap states start to trap electrons. The decrease of $I_D$ over time under continuous illumination is analogous to the decrease of visual sensitivity of photoreceptor cells over time under a bright light condition. The mechanism of trapping electrons is similar to the bleaching of photopigment in the retina, leading to the decrease of visual sensitivity of photoreceptors. A positive $V_G$ (horizontal cell) gives rise to electron trapping (photopigment bleaching).

Figure 5:
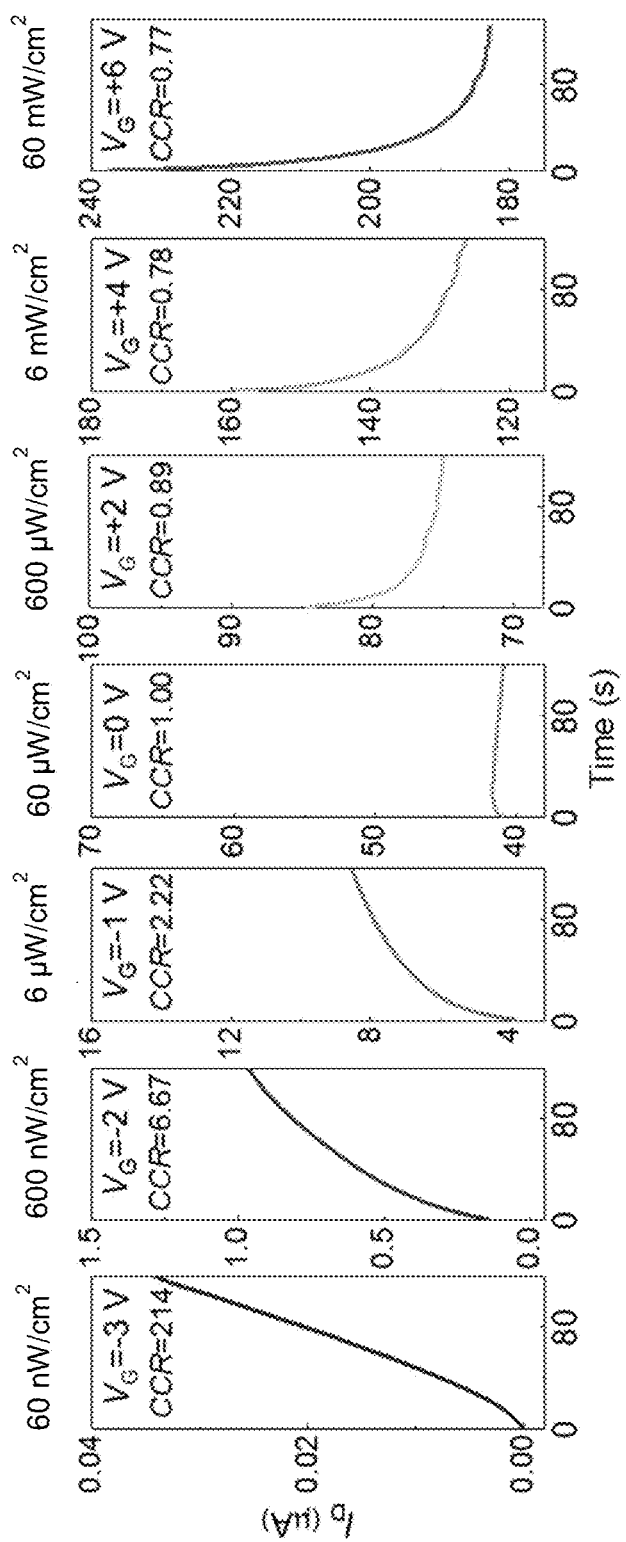
FIG. 5 depicts time-dependent profiles of the drain current under different gate-source voltages, where each gate-source voltage is selected according to the incident power density.

Based on the time-varying excitation or inhibition characteristics depending on $V_G$, one can realize the visual adaptation function (both scotopic and photopic adaptations) by the phototransistor 100. One can apply a more negative $V_G$ under a dim-background condition for invoking excitation characteristics, and a more positive $V_G$ under a bright-light condition for invoking inhibition behavior of the phototransistor 100. For illustration, FIG. 5 depicts time-dependent profiles of $I_D$ of the sensor 100 under different $V_G$ values, where individual $V_G$ values are selected according to $P_{in}$. For example, the CCRs are 214, 6.67, and 2.22 under dim-light conditions of 60 $nW/cm^2$, 600 $nW/cm^2$ and 6 $\mu W/cm^2$ by applying $V_G$ of −3V, −2V and −1V (scotopic adaptation), respectively. In contrast, the CCRs are 0.89, 0.78 and 0.77 under bright-light conditions of 600 $\mu W/cm^2$, 6 $mW/cm^2$ and 60 $mW/cm^2$ by applying $V_G$ of +2V, +4V and +6V (photopic adaptation), respectively.

Figure 6:
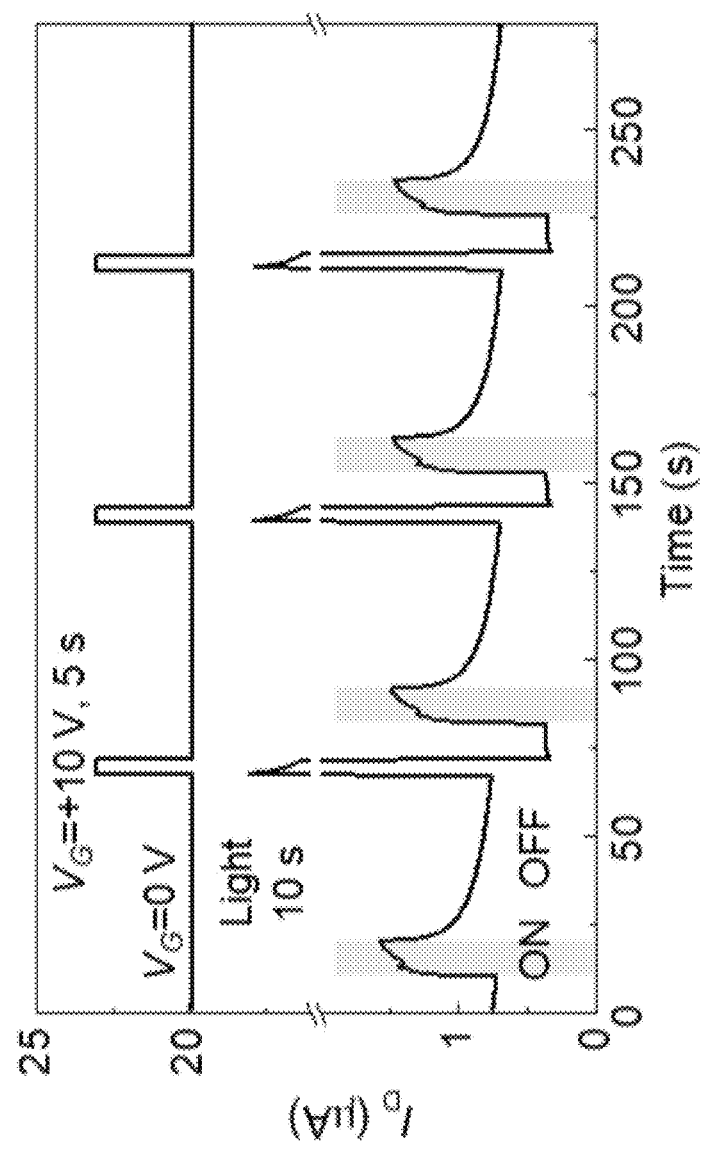
FIG. 6 depicts an operating sequence of drain current readouts obtained from the phototransistor.

The trapping and de-trapping processes can change the conductance of the phototransistor 100, and can be electrically reset by the applied $V_G$. Therefore, the phototransistor 100 can work as an optoelectronic memory by recording the perceived light information over a long time even after turning off the light stimulus due to the persistent photoconductivity effect, as shown in FIG. 6. FIG. 6 depicts an operating sequence of $I_D$ readouts obtained from the phototransistor 100.

Based on the light-intensity-dependent and time-dependent characteristics of the phototransistor 100, the sensing and adaptation functions (both scotopic and photopic adaptations) in the human retina can be emulated with the $MoS_2$ phototransistor array. An 8×8 $MoS_2$ phototransistor array was implemented for experimentally demonstrating perception of the pattern of "8".

Figure 7:
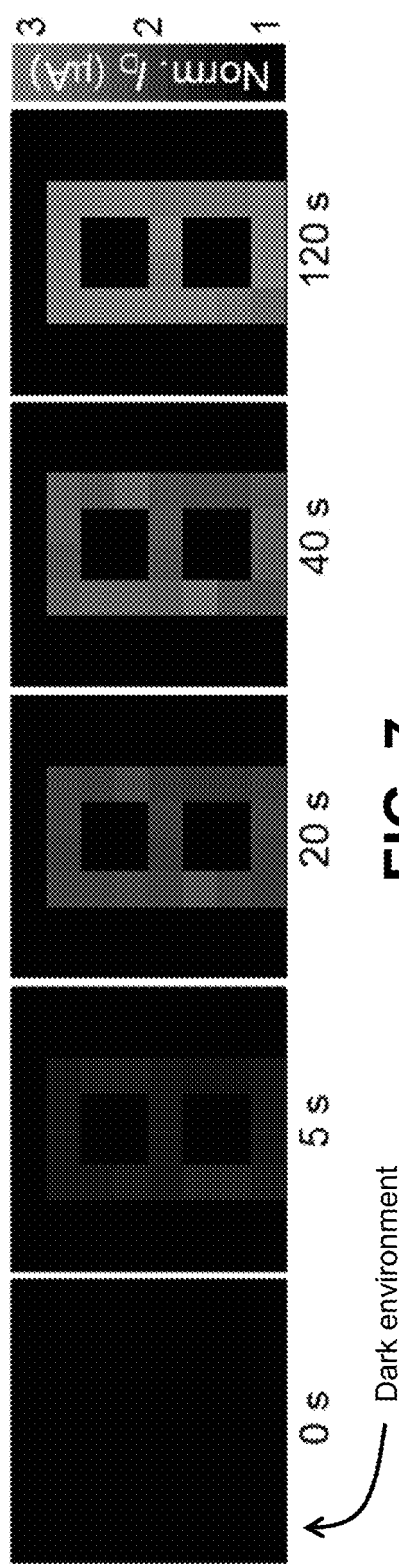
FIG. 7 shows an experimental result of using a phototransistor array to obtain a perceived pattern of "8" at different time instants under dim-light illumination.

For the scotopic adaptation test of the $MoS_2$ phototransistor array, a gate-source voltage of $V_G$=−2V was applied to all phototransistors in the array. In the array, 20 phototransistors corresponding to the image "8" pattern were illuminated with a weak light of 6 $\mu W/cm^2$, and the remaining 44 phototransistors were under a dim-background illumination of 600 $nW/cm^2$. FIG. 7 shows the perceived pattern of "8" obtained at different time instants under dim-light illumination, where the perceived pattern was extracted from $I_D$ values at these time instants. The pattern of "8" could not be recognized at the beginning with zero contrast because of low photocurrent under relatively low light illumination. With the visual adaptation effect, the image contrast increased over time. This image contrast enhancement over time is similar to the scotopic adaptation of the retina.

Figure 8:
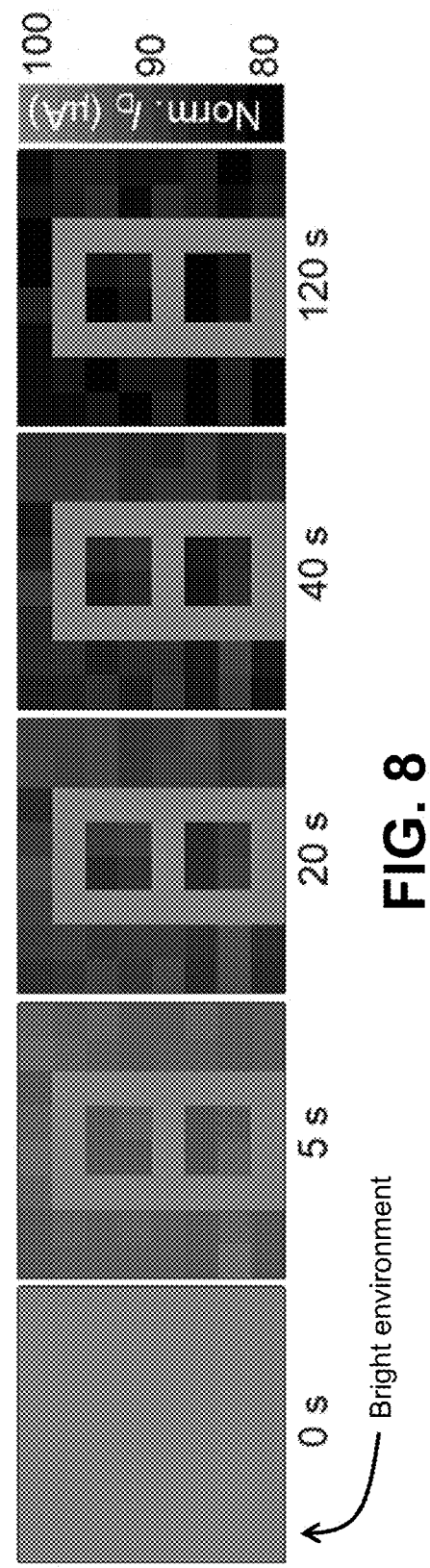
FIG. 8 shows an experimental result of using the phototransistor array to obtain a perceived pattern of "8" at different time instants under bright-light illumination.

For the photopic adaptation test, all phototransistors in the array were applied with $V_G$=+4V. The 20 phototransistors corresponding to the pattern of "8" were illuminated with a strong light beam of 60 $mW/cm^2$, and the other 44 phototransistors were subject to a bright background illumination of 6 mW/cm². FIG. 8 shows the perceived pattern of "8" at different time instants under bright light. The perceived pattern was extracted from $I_D$ values at these time instants. The image contrast of the pattern of "8" was zero at the time instant of 0 s, and increased over time. The "dazzling" pattern of "8" at the initial stage was gradually changed to a comfortable image for the human eye, similar to the photopic adaptation of the retina. The phototransistor array can realize image brightness modulation and contrast enhancement when a positive $V_G$ is applied to the phototransistors in the array.

Figure 9:
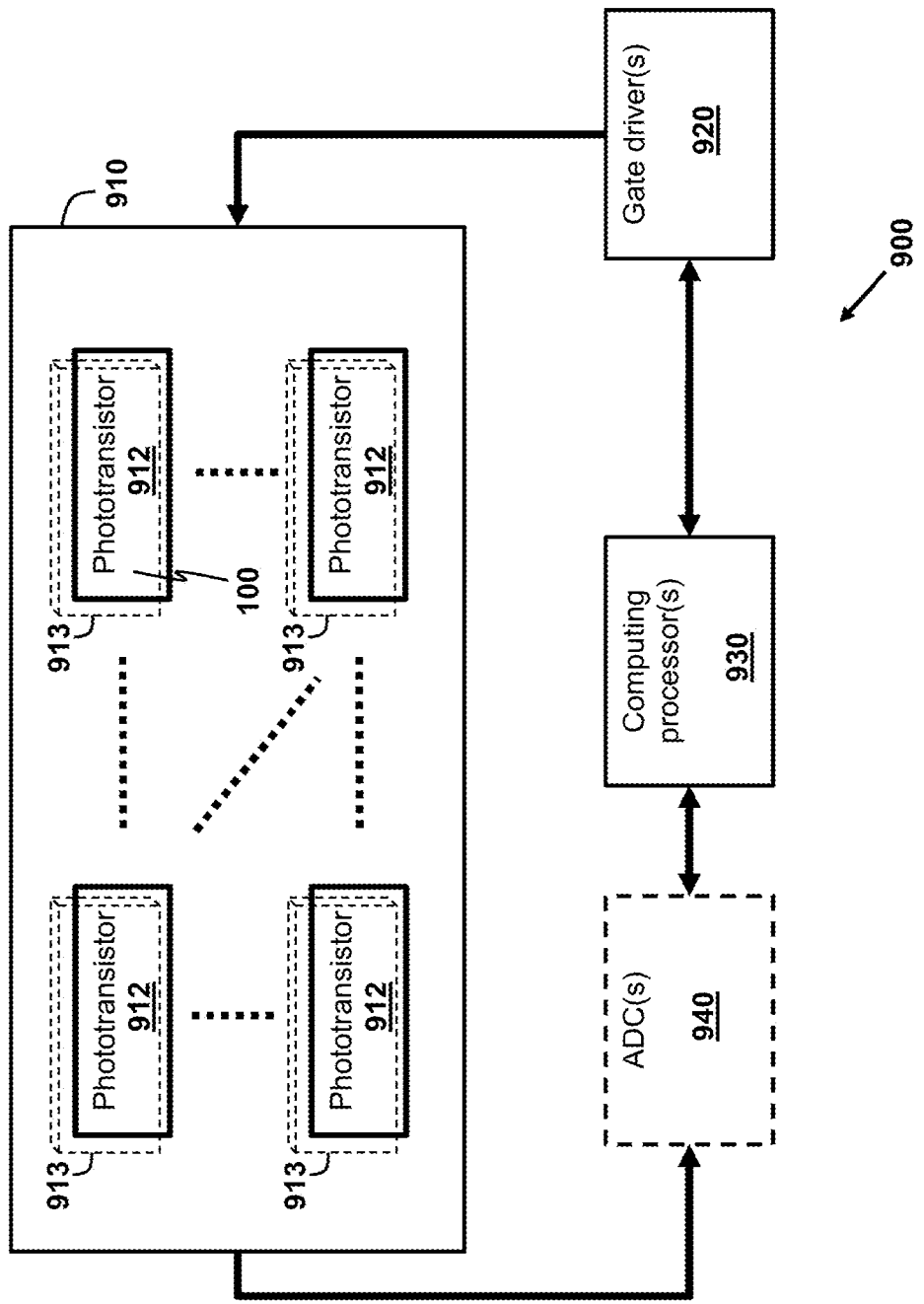
FIG. 9 depicts a bio-inspired imaging device for imaging an image in accordance with an exemplary embodiment of the present invention, where a phototransistor using a TMD or a TMO as a semiconductor material is used as an individual adaptive vision sensor for imaging a pixel of the image.

In the disclosed bio-inspired imaging device for imaging an image, the adaptive vision sensor 100 is used as a basic unit for imaging a pixel of the image. FIG. 9 depicts an exemplary bio-inspired imaging device 900.

The imaging device 900 comprises an imaging sensor 910. The imaging sensor 910 comprises a plurality of phototransistors 912 collectively used for imaging the image. Usually, the plurality of phototransistors 912 is arranged as a rectangular array in the imaging sensor 910 for capturing the image. Although the rectangular-array arrangement is most often used in practice, the present invention is not limited to this arrangement. Other arrangements, such as a circular arrangement, may be used to organize the plurality of phototransistors 912.

Advantageously, each of the phototransistors 912 is realized as an embodiment of the phototransistor 100. Practically, most often all the phototransistors 912 are realized with the same embodiment of the phototransistor 100. For illustration of the imaging device 900, without loss of generality the phototransistor 100 is used to illustrate an individual phototransistor in the plurality of phototransistors 912.

Refer to FIG. 1. The phototransistor 100 used for converting a light beam 191 of the image to an electrical signal 192 is a FET comprising a source 130, a drain 135, a gate 120 and a channel layer 110. The channel layer 110 connects the source 130 and the drain 135. Furthermore, the channel layer 110 is an atomically-thin layer composed of a 2D semiconductor material for generating charge carriers (electrons and/or holes) upon irradiation by the light beam 191 in forming the electrical signal 192 (which is the drain current $I_D$). Examples of appropriate 2D semiconductor materials include: TMDs such as $MoS_2$, $WS_2$, $MoSe_2$, $WSe_2$, $MoTe_2$; TMOs such as $MoO_3$ and $V_2O_5$; MXenes such as $Ti_2C$; BP; nanoribbon graphene; and carbon nanotubes. As an advantageous feature, the channel layer 110 is formed with defects trap states 115 for trapping a portion of the charge carriers such that intensity information of the light beam 191 is memorized by the defects trap states 115. Specifically, the defects trap states 115 are intentionally introduced to the channel layer 110. As mentioned earlier, UVO treatment or oxygen plasma treatment may be used to create the defects trap states 115 on the surface of channel layer 110. Note that the channel layer 110 is positioned in proximity to the gate 120. As a result and based on the explanation regarding FIG. 4, a gate-source voltage between the gate 120 and the source 130 directs the defects trap states 115 to de-trap the trapped portion of the charge carriers over time or to further trap an additional portion of the charge carriers over time. It allows the phototransistor 100 to exhibit a time-dependent excitation or inhibition effect on the electrical signal 192. Thereby, it enables the plurality of phototransistors 912 to mimic visual adaptation of human vision in imaging the image to thereby achieve in-sensor visual adaptation.

There are several advantages resulted from the imaging sensor 910, which produces an effect similar to visual adaptation of human vision. First, as mentioned above, the produced effect enables the imaging device 900 to provide a large dynamic range in imaging the image, thus facilitating the imaging device 900 to perform imaging under a wide range of illumination conditions from dim-light conditions to bright-light conditions. Second, the imaging sensor 910 is self-autonomous in achieving the visual-adaptation effect. It allows in-sensor visual adaptation to be gradually achieved over time automatically even if the gate-source voltage is maintained at a certain constant level. It simplifies the design of an algorithm in controlling the gate-source voltage. Third, the imaging sensor 900 integrates light sensing, image memorization and visual adaptation in one array of phototransistors. It can largely simplify design of artificial vision circuitry and exhibit a wide perception range and improvement in image recognition rate. Note that the imaging sensor 910 is a neuromorphic vision sensor in that visual adaptation functions are built-in functions in the imaging sensor 910. External processing of the analog electrical signals generated by the plurality of phototransistors 912, which often involves complicated circuitry for analog signal processing, is avoided. The analog outputs of the imaging sensor 900 can be directly used as a human visual perception in neuromorphic processing.

Other implementation details of the imaging sensor 910 are elaborated as follows.

One important parameter in designing the channel layer 110 is the number of monolayers of the selected semiconductor compound. Although the channel layer 110 is allowed to have at most nine monolayers, it is believed that one or two monolayers are preferable in forming the channel layer 110. The rationale is that the defects trap states 115 are mostly located on the top surface of the channel layer 110. Keeping the number of monolayers to one or two may enable a substantial portion of the charge carriers to be trapped in the defects trap states 115. It is believed that the resultant in-sensor scotopic or photopic adaptation process (i.e. time-dependent excitation or inhibition effect on the electrical signal 192) may be more effective in adapting the photosensitivity of the phototransistor 100 to the intensity level of the light beam 191.

Since the channel layer 110 is held in proximity to the gate 120, preferably the phototransistor 100 further comprises a dielectric layer 125 sandwiched between the gate 120 and the channel layer 110. The dielectric layer 125 is sufficiently thin to allow an electric field generated from the gate 120 to substantially penetrate into the channel layer 110. It is also preferable that the dielectric layer 125 is a high-κ dielectric having a high dielectric constant as compared to silicon dioxide. In certain embodiments, the dielectric layer 125 is a high-κ dielectric substantially composed of a material selected from aluminum oxide ($Al_2O_3$), hafnium dioxide ($HfO_2$), zirconium dioxide ($ZrO_2$) and hexagonal boron nitride (h-BN).

In certain embodiments, the plurality of phototransistors 912 is formed on a substrate 140, e.g., silicon. In particular, the gate 120 of the phototransistor 100 is located on the substrate 140.

The gate 120, the source 130 and the drain 135 are electrodes made of appropriate conductive materials.

Preferably, the source 130 and the drain 135 are made of metal for an advantage of high conductivity. Generally, an appropriate metal is required to be selected because different 2D semiconductor materials selected in forming the channel layer 110 need to match to different metals with different work functions. Gold (Au) is a high-work-function metal, which is suitable for contacting with p-type semiconductors.

For n-type semiconductors, a low-work-function metal, e.g., titanium (Ti), nickel (Ni), indium (In) and bismuth (Bi), is suitable. Gold may be deposited on the low-work-function metal as a protective layer against oxidation by air.

Apart from metals, other conductive materials may also be used for forming the source 130 and the drain 135. These other conductive materials may be ITO, graphene, etc.

The gate 120 may be made of metal, ITO, graphene, etc.

Figure 10:
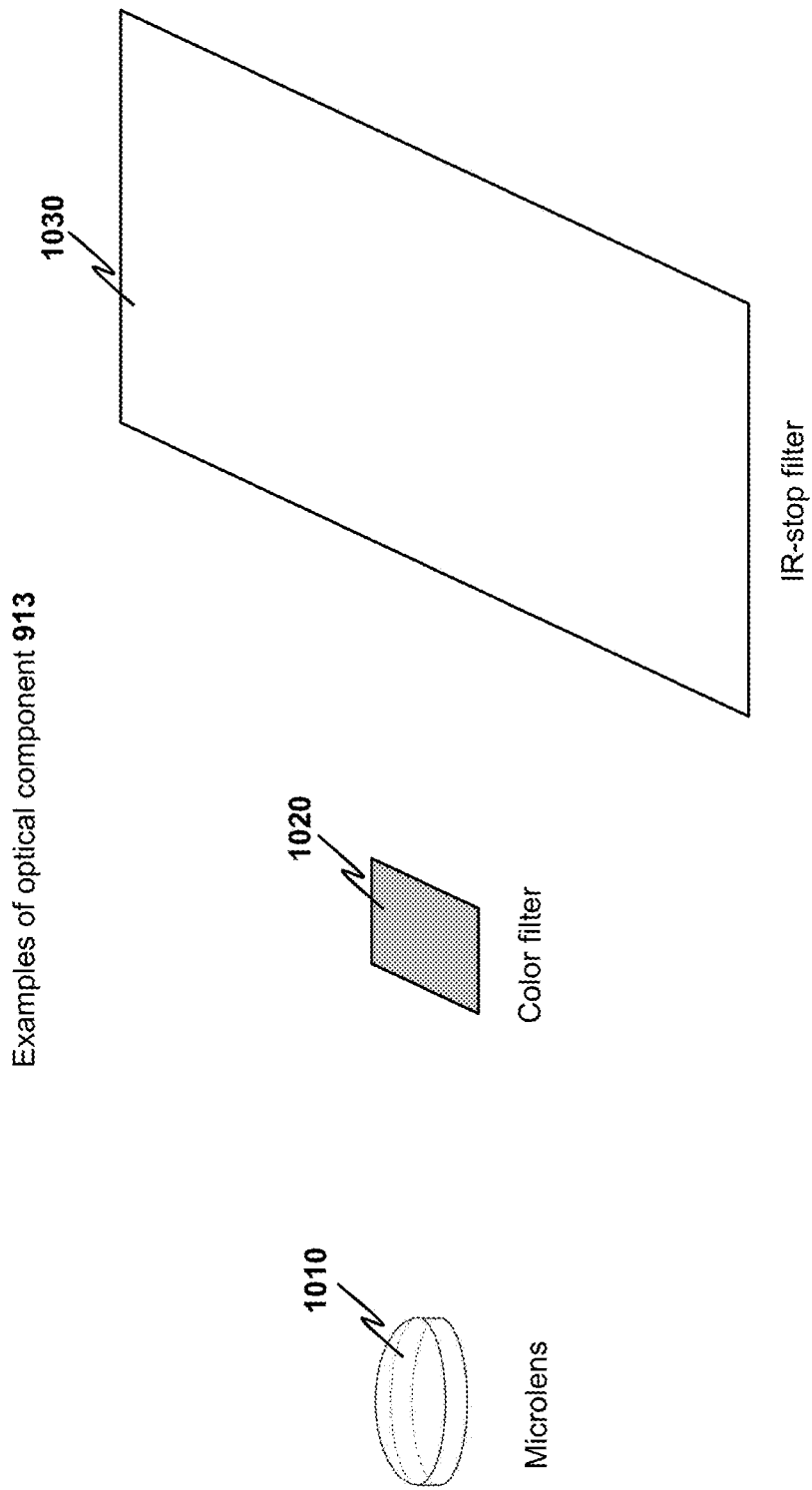
FIG. 10 depicts examples of optical components useful for optically processing a light beam before the light beam reaches the phototransistor for photoconversion.

Although the plurality of phototransistors 912 may directly receive the image for imaging, it is advantageous to optically process the image before it is imaged as in other commonly-used imaging sensors. Preferably, the imaging sensor further comprises a plurality of optical components 913 for optically processing respective light beams of the image before the respective light beams reach the plurality of phototransistors 912. FIG. 10 depicts some examples of optical components that are found in existing imaging sensors in the art and that are useful for realizing the plurality of optical components 913. The plurality of optical components 913 may include a microlens 1010 located in proximity to the phototransistor 100 for focusing the light beam 191 onto the phototransistor 100. The plurality of optical components 913 may further include a color filter 1020 located in proximity to the phototransistor 100 for enabling the phototransistor 100 to extract color information of the light beam 191. It is also possible that the plurality of optical components 913 further includes an IR-stop filter 1030 overlying the plurality of phototransistors 912 such that the IR-stop filter 1030 filters off IR components of the light beam 191 before the phototransistor 100 converts the light beam 191 into the electrical signal 192. The use of the IR-stop filter 1030 may enhance the contrast of the image in case the semiconductor compound selected to form the channel layer 110 is undesirably responsive to the IR light.

Refer to FIG. 9. Generally, the imaging device 900 is incorporated with electronic circuits working with the imaging sensor 910 in imaging the image.

Preferably, the imaging device 900 further comprises one or more gate drivers 920 and one or more computing processors 930. The one or more gate drivers 920 are used for providing respective gate-source voltages to the plurality of phototransistors 912. The one or more gate drivers 920 are controllable by the one or more computing processors 930. The one or more computing processors 930 are used for determining the respective gate-source voltages and controlling the one or more gate drivers 920 to provide the determined respective gate-source voltages to the plurality of phototransistors 912 for causing the imaging sensor 910 to mimic visual adaptation in imaging the image.

Usually, the one or more computing processors 930 are also used for controlling other electronic components and subsystems in the imaging device 900.

As mentioned above, a negative $V_G$ can be applied to the phototransistor 100 to invoke an in-sensor scotopic adaptation process, which is useful for imaging under a dim-background condition. Similarly, a positive $V_G$ can be applied to the phototransistor 100 to invoke an in-sensor photopic adaptation process, which is useful for imaging under a bright-light condition. Preferably, the one or more computing processors 930 are further configured to control the one or more gate drivers 920 to provide: (1) a positive gate-source voltage to an individual phototransistor in the plurality of phototransistors 912 if photopic adaptation is mimicked in imaging the image; and (2) a negative gate-source voltage to the individual phototransistor if scotopic adaptation is mimicked in imaging the image.

In certain embodiments, the respective gate-source voltages applied to the plurality of phototransistors 912 at each time instant are same. It allows reduced complexity implementation of the one or more gate drivers 920 and possibly the one or more computing processors 930 in comparison to an opposite case that the respective gate-source voltages are not required to have the same value.

If neuromorphic processing, which directly uses analog electrical signals generated from imaging sensor 910, is not targeted to, most often the one or more computing processors 930 are further used to read respective electrical signals generated from the plurality of phototransistors 912. Since the electrical signal 192 generated from the phototransistor 100 is an analog signal, it is required to digitize the electrical signal 192 before the electrical signal 192 is recognizable by the one or more computing processors 930. Optionally, the imaging device 900 further comprises one or more ADCs for digitizing the respective electrical signals received from the plurality of phototransistors 912 to form a plurality of digitized electrical signals. The plurality of digitized electrical signals is readable by the one or more computing processors 930.

Figure 11:
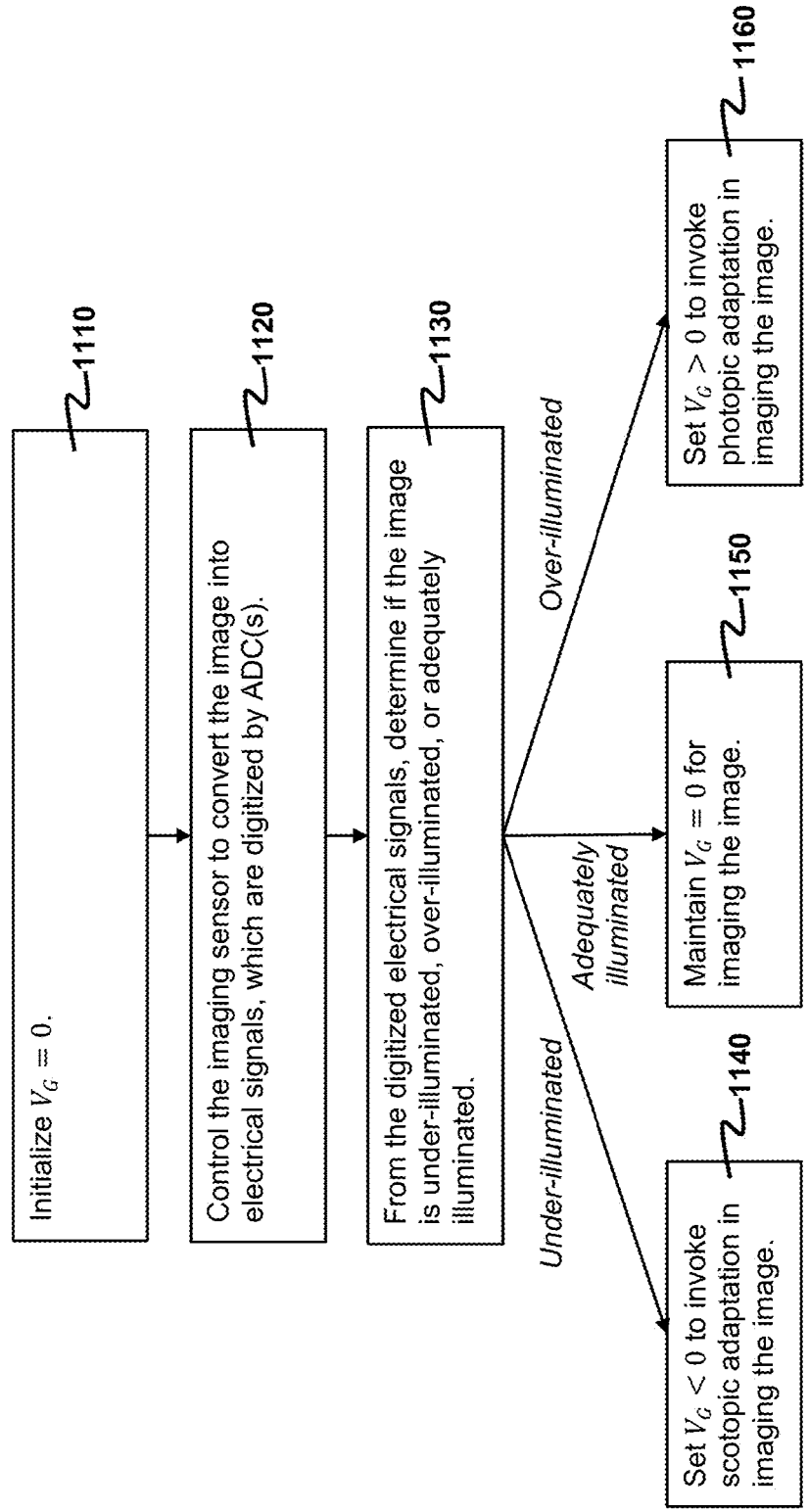
FIG. 11 depicts an exemplary procedure of determining whether scotopic or photopic adaptation is required in imaging the image so as to determine the polarity of required gate-source voltage.

It is desirable that the one or more computing processors 930 can automatically determine the polarity of the respective gate-source voltages supplied to the plurality of phototransistors 912 for invoking scotopic or photopic adaptation as desired in imaging the image. This determination involves determining whether the image is under bright-light illumination or under dim-light illumination. FIG. 11 depicts an exemplary procedure executable by the one or more computing processors 930 for determining the polarity of the respective gate-source voltages.

In step 1110, the respective gate-source voltages are initialized to zero volt ($V_G$=0V). The one or more computing processors 930 control the one or more gate drivers 920 to feed the plurality of phototransistors 912 with zero gate-source voltages.

In step 1120, the one or more computing processors 930 controls the imaging sensor 910 to employ the plurality of phototransistors 912 to photoconvert the image into the respective electrical signals. The respective electrical signals are subsequently digitized by the one or more ADCs 940 to form the plurality of digitized electrical signals.

In step 1130, the one or more computing processors 930 determine, from the plurality of digitized electrical signals, if the image is under-illuminated, over-illuminated, or adequately illuminated. A typical rule for determining if the image is under-illuminated is to check whether an average digitized electrical signal is less than a certain small value. To determine if the image is over-illuminated, one typical rule is to determine if the proportion of image pixels reaching an upper limit of possible electrical-signal value exceeds a certain large percentage (e.g., 50%). If it is determined that the image is neither under-illuminated nor over-illuminated, the image is considered to be adequately illuminated. Those skilled in the art will appreciate that other rules may also be used for determining whether the image is under-illuminated, over-illuminated, or adequately illuminated.

If the step 1130 determines that the image is under-illuminated, scotopic adaptation is required. A negative gate-source voltage ($V_G$<0V) is applied to each of the phototransistors 912 to invoke an in-sensor scotopic adaptation process in subsequent imaging of the image (step 1140). If the image is determined to be over-illuminated, a positive gate-source voltage ($V_G$>0V) is applied to each of the phototransistors 912 to invoke an in-sensor photopic adaptation process in subsequent imaging of the image (step 1160). If the step 1130 finds that the image is adequately illuminated, $V_G=0V$ is maintained in subsequent imaging of the image (step 1150).

In practical situations, the imaging device 900 is often required to capture a sequence of images to form a video signal. In certain embodiments, the one or more computing processors 930 are further configured to: receive the plurality of digitized electrical signals obtained at a time instant to form an image signal of the image at the time instant; and collect respective image signals obtained at a plurality of successive time instants to form a sequence of image signals.

As one advantageous feature of the imaging device 900, the sequence of image signals may be encoded such that Weber's law is satisfied. As explained above, Weber's law can be satisfied via applying locally different $V_G$ values to the plurality of phototransistors 912 according to different $P_{in}$ values. In certain embodiments, the one or more computing processors 930 are further configured to adjust the gate-source voltage applied to the phototransistor 100 (namely, the individual phototransistor in the plurality of phototransistors 912) according to an incident power density of the light beam 191 of each image in an optical-image sequence for realizing Weber's law in generating the sequence of image signals from the optical-image sequence.

In one implementation of the imaging device 900, the one or more gate drivers 920, the one or more computing processors 930 and the one or more ADCs 940 are integrated in the imaging sensor 910 for achieving miniaturization of the imaging device 900. In another implementation option, the one or more gate drivers 920 and the one or more ADCs 940 are housed in the imaging sensor 910, allowing the imaging sensor 910 to be conveniently implemented with an entirely digital interface for communicating with the one or more computing processors 930. It is also possible that the one or more gate drivers 920, the one or more computing processors 930 and the one or more ADCs 940 are outside the imaging sensor 910 in the imaging device 900. Other implementation options are possible.

The present invention may be embodied in other specific forms without departing from the spirit or essential characteristics thereof. The present embodiment is therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A bio-inspired imaging device for imaging an image with in-sensor visual adaptation comprising:
   an imaging sensor comprising a plurality of phototransistors, an individual phototransistor for converting a light beam of the image to an electrical signal being a field-effect transistor (FET) comprising:
      a source, a drain and a gate; and
      a channel layer connecting the source and the drain, the channel layer being an atomically-thin layer composed of a two-dimensional (2D) semiconductor material for generating charge carriers upon irradiation by the light beam in forming the electrical signal, wherein the channel layer is formed with defects trap states for trapping a portion of the charge carriers such that intensity information of the light beam is memorized by the defects trap states, and wherein the channel layer is positioned in proximity to the gate such that a gate-source voltage between the gate and the source directs the defects trap states to de-trap the trapped portion of the charge carriers over time or to further trap an additional portion of the charge carriers over time, allowing the individual phototransistor to exhibit a time-dependent excitation or inhibition effect on the electrical signal to thereby enable the imaging sensor to mimic visual adaptation of human vision in imaging the image;
   one or more gate drivers for providing respective gate-source voltages to the plurality of phototransistors;
   one or more analog-to-digital converters (ADCs) for digitizing respective electrical signals received from the plurality of phototransistors to form a plurality of digitized electrical signals; and
   one or more digital computing processors configured to:
      determine the respective gate-source voltages according to the plurality of digitized electrical signals; and
      control the one or more gate drivers to provide the determined respective gate-source voltages to the plurality of phototransistors for causing the imaging sensor to mimic visual adaptation in imaging the image.

2. The bio-inspired imaging device of claim 1, wherein the one or more digital computing processors are further configured to control the one or more gate drivers to provide:
   a positive gate-source voltage to the individual phototransistor if photopic adaptation is mimicked in imaging the image; and
   a negative gate-source voltage to the individual phototransistor if scotopic adaptation is mimicked in imaging the image.

3. The bio-inspired imaging device of claim 1, wherein:
   the respective gate-source voltages applied to the plurality of phototransistors at each time instant are same, allowing reduced complexity implementation of the one or more gate drivers.

4. The bio-inspired imaging device of claim 1, wherein the atomically-thin layer consists of one or two monolayers of the 2D semiconductor material.

5. The bio-inspired imaging device of claim 1, wherein the 2D semiconductor material is selected from transition metal dichalcogenides (TMDs), transition metal oxides (TMOs), MXenes, boron phosphide (BP), nanoribbon graphene and carbon nanotubes.

6. The bio-inspired imaging device of claim 1, wherein the 2D semiconductor material is molybdenum disulfide ($MoS_2$).

7. The bio-inspired imaging device of claim 1, further comprising:
   a dielectric layer sandwiched between the gate and the channel layer.

8. The bio-inspired imaging device of claim 7, wherein the dielectric layer is substantially composed of a material selected from aluminum oxide ($Al_2O_3$), hafnium dioxide ($HfO_2$), zirconium dioxide ($ZrO_2$) and hexagonal boron nitride (h-BN).

9. The bio-inspired imaging device of claim 7, wherein the plurality of phototransistors is formed on a substrate, the gate being located on the substrate.

10. The bio-inspired imaging device of claim 9, wherein the source and drain are made of metal, indium tin oxide or graphene.

11. The bio-inspired imaging device of claim 9, wherein the gate is made of metal, indium tin oxide or graphene.

12. The bio-inspired imaging device of claim 1, wherein the plurality of phototransistors is arranged as a rectangular array in the imaging sensor for capturing the image.

13. The bio-inspired imaging device of claim 1, wherein the imaging sensor further comprises:
a plurality of optical components for optically processing respective light beams of the image before the respective light beams reach the plurality of phototransistors, the optical components including a microlens located in proximity to the individual phototransistor for focusing the light beam onto the individual phototransistor.

14. The bio-inspired imaging device of claim 13, wherein the plurality of optical components further includes a color filter located in proximity to the individual phototransistor for enabling the individual phototransistor to extract color information of the light beam.

15. The bio-inspired imaging device of claim 13, wherein the plurality of optical components further includes an infrared- (IR-) stop filter overlying the plurality of phototransistors for filtering off IR components of the respective light beams before the image is imaged by the plurality of phototransistors.

16. The bio-inspired imaging device of claim 1, wherein the one or more digital computing processors are further configured to:
receive the plurality of digitized electrical signals obtained at a time instant to form an image signal of the image at the time instant; and
collect respective image signals obtained at a plurality of successive time instants to form a sequence of image signals.

17. The bio-inspired imaging device of claim 16, wherein:
the one or more digital computing processors are further configured to adjust the respective gate-source voltages applied to the plurality of phototransistors according to an incident power density of the light beam of an individual image in an optical-image sequence for realizing Weber's law in generating the sequence of image signals from the optical-image sequence.

* * * * *